United States Patent [19]

Russo et al.

[11] Patent Number: 4,875,210

[45] Date of Patent: Oct. 17, 1989

[54] AUTOMATIC CIRCUIT TESTER CONTROL SYSTEM

[75] Inventors: John L. Russo, Norwood; Robert H. Van der Kloot, Medford, both of Mass.

[73] Assignee: Teradyne, Inc., Boston, Mass.

[21] Appl. No.: 141,202

[22] Filed: Jan. 6, 1988

[51] Int. Cl.⁴ .......................................... G01R 31/28
[52] U.S. Cl. ...................................................... 371/27
[58] Field of Search .............................. 371/27, 25, 20

[56] References Cited

U.S. PATENT DOCUMENTS

| | | | |
|---|---|---|---|
| 4,451,918 | 5/1984 | Gillette | 371/27 |
| 4,586,181 | 4/1986 | Shimizu | 371/27 |
| 4,670,879 | 6/1987 | Okino | 371/27 |
| 4,759,021 | 7/1988 | Kawaguchi et al. | 371/27 |

Primary Examiner—Charles E. Atkinson

[57] ABSTRACT

Apparatus for providing high speed control of digital test patterns in automatic test equipment, the apparatus including a data random access memory (RAM) storing data of nonsequential vectors, a sequential data memory storing blocks of data of sequential vectors, the sequential data memory having higher capacity than the data RAM, a formatter for receiving data from the data RAM or the sequential data memory and using it to provide inputs to a circuit under test, and a sequence controller controlling selective routing of data from the data RAM or the sequential data memory to the formatter.

24 Claims, 6 Drawing Sheets

| TYPE OF USER CODE | STATE ADDRESS | PRAM INSTRUCTION | SAM INSTRUCTION | VECTOR BUS DATA SOURCE |
|---|---|---|---|---|
| VECTORS WITH CONDITIONALS WILL BE SOURCED FROM PRAM | 0 : : : 101 | SOURCE DATA : : : SOURCE DATA | NO OPERATION : : : NO OPERATION | PRAM DATA : : : PRAM DATA |
| VECTORS WITHOUT CONDITIONALS WILL BE SOURCED FROM SAM | 102 | SOURCE DATA | LOAD LOW ADDRESS | PRAM DATA |
| | 103 | SOURCE DATA | LOAD MID ADDRESS | PRAM DATA |
| | 104 | SOURCE DATA | LOAD HIGH ADDRESS | PRAM DATA |
| | 105 | SOURCE DATA | NO OPERATION | PRAM DATA |
| | 106 | SOURCE DATA | NO OPERATION | PRAM DATA |
| | 107 | SOURCE DATA | NO OPERATION | PRAM DATA |
| [25 STATE BUS ADDRESSES ARE NEEDED TO PRIME THE SAM FOR SOURCING DATA] | 108 | SOURCE DATA | NO OPERATION | PRAM DATA |
| | 109 | SOURCE DATA | NO OPERATION | PRAM DATA |
| | 110 | SOURCE DATA | NO OPERATION | PRAM DATA |
| | 111 | SOURCE DATA | NO OPERATION | PRAM DATA |
| | 112 | SOURCE DATA | NO OPERATION | PRAM DATA |
| | 113 | SOURCE DATA | NO OPERATION | PRAM DATA |
| | 114 | SOURCE DATA | NO OPERATION | PRAM DATA |
| | 115 | SOURCE DATA | NO OPERATION | PRAM DATA |
| | 116 | SOURCE DATA | NO OPERATION | PRAM DATA |
| | 117 | SOURCE DATA | NO OPERATION | PRAM DATA |
| | 118 | SOURCE DATA | NO OPERATION | PRAM DATA |
| | 119 | SOURCE DATA | NO OPERATION | PRAM DATA |
| | 120 | NO SOURCE | SOURCE & INCREMENT | PRAM DATA |
| | 121 | NO SOURCE | SOURCE & INCREMENT | PRAM DATA |
| | 122 | NO SOURCE | SOURCE & INCREMENT | PRAM DATA |
| | 123 | NO SOURCE | SOURCE & INCREMENT | PRAM DATA |
| | 124 | NO SOURCE | SOURCE & INCREMENT | PRAM DATA |
| | 125 | NO SOURCE | SOURCE & INCREMENT | PRAM DATA |
| | 126 | NO SOURCE | SOURCE & INCREMENT | PRAM DATA |
| [SAM SOURCING A LARGE BLOCK OF DATA WITH FIVE STATE BUS ADDRESSES] | 127 : : : 131 | NO SOURCE : : : NO SOURCE | SOURCE & INCREMENT : : : SOURCE & INCREMENT | SAM DATA : : : SAM DATA |
| [7 STATE BUS ADDRESSES ARE NEEDED TO PRIME THE PRAM FOR SOURCING DATA] | 132 | SOURCE DATA | NO OPERATION | SAM DATA |
| | 133 | SOURCE DATA | NO OPERATION | SAM DATA |
| | 134 | SOURCE DATA | NO OPERATION | SAM DATA |
| | 135 | SOURCE DATA | NO OPERATION | SAM DATA |
| | 136 | SOURCE DATA | NO OPERATION | SAM DATA |
| | 137 | SOURCE DATA | NO OPERATION | SAM DATA |
| | 138 | SOURCE DATA | NO OPERATION | SAM DATA |
| SOURCE CONDITIONAL VECTORS FROM PRAM | 139 | SOURCE DATA | NO OPERATION | PRAM DATA |
| | 140 | SOURCE DATA | NO OPERATION | PRAM DATA |
| | 141 | SOURCE DATA | NO OPERATION | PRAM DATA |

FIG. 7

AUTOMATIC CIRCUIT TESTER CONTROL SYSTEM

FIELD OF THE INVENTIONi

The invention relates to controlling apparatus for automatically testing electronic circuits.

BACKGROUND OF THE INVENTION

In apparatus for automatically testing electronic circuits, digital test patterns are stored in memory and used to provide input test sigals applied to nodes of a circuit under test ("CUT"), and the resulting outputs from the CUT are compared with expected outputs. Test apparatus can also include such analog instruments as high frequency and low frequency signal generators to provide analog test signals to the CUT and high and low frequency digitizers and associated capture memory to digitize and store results.

In order to simultaneously provide control signals for the test apparatus and deliver a large number of bits of data to the CUT synchronously with the clocking of the CUT at its high rate, a high speed sequence controller is used to provide the control bits (also referred to as "microcode" herein) and data bits in parallel at high speed. (The microcode plus data bits at a given clock period are referred to as a "vector".) The control bits are included in a random access memory ("RAM") in the sequence controller, for example, 16K deep to provide 16K instruction steps that can be randomly accessed upon providing the appropriate address to the RAM on an address bus (often referred to as a "state bus") controlled by an address generator in the sequence controller. Control bits associated with the various instruments and test pattern memories could also be located in respective microcode RAMs distributed across separate boards and accessed by the state address bus.

When running tests involving a large number of test data, there often are large blocks of vectors in which there are sequential steps of test data to be applied to the circuit under test, and the microcode does not change for a large number of clock periods. Such vectors are referred to herein as "sequential vectors". Where there are conditional statements or jumps in the test program, the system must be able to randomly jump to a state address that does not follow the current address; such vectors are referred to as "nonsequential vectors".

Because of the expense of high-speed static RAM and the large number of data signals used in some test patterns, test data are sometimes stored in bulk in a high-capacity memory of slower, and less expensive, dynamic RAMs, which are used to transfer blocks of test data at one time to reload high-speed static RAMs. For example, Gillette U.S. Pat. No. 4,451,958, discloses an automatic circuit tester in which large blocks of test patterns are loaded from interleaved dynamic RAMs into a first static RAM while a second static RAM is providing test data to the CUT, and the test patterns are then loaded into the second static RAM while the first is providing test data and so on. When writing a control program for the system using the dynamic RAMs to alternately provide test data to alternate static RAMs, the programmer must make sure that he does not have any conditional statements or jumps to steps that are not in the same group loaded into a static RAM at the same time.

SUMMARY OF THE INVENTION

It has been discovered that by providing a data RAM storing data of nonsequential (e.g., conditional) vectors, a sequential data memory storing blocks of data of sequential vectors and having higher capacity than the data RAM, and test sequence control circuitry to selectively route data from the data RAM or sequential data memory to a formatter to provide inputs to a circuit under test, test program writing and execution could be greatly simplified. The program is written as if there were deep storage capacity for both microcode and data in all vectors in the program and as if any vector can be randomly accessed, e.g., when the program jumps at conditional vectors, without regard to the address to which the program jumps. A post processor reviewing the program identifies sequential vectors and has the data in them listed for routing to the sequential memory and identifies nonsequential vectors and has the data in them listed for routing to the data RAM. During testing, the data in the data RAM are randomly accessed until there is a block of sequential vectors, at which time the data are accessed sequentially from the sequential data memory.

In preferred embodiments the data RAM includes static RAMs, and the sequential data memory includes a plurality of dynamic RAMs that are individually slower than the static RAMs and are combined to provide high-speed data transfer; the sequential memory dynamic RAMs are each connected to provide a multibit parallel output to a respective shift register, the multibit output corresponding to a single bit of a plurality of consecutive sequential vectors, the single bit serial outputs of the registers being provided in parallel at high speed to provide a sequential vector; the apparatus includes a sequence address generator providing addresses to a state bus, and there are first and second microcode RAMs loaded with microcode for the data RAM and the sequential memory; the first microcode RAM includes instructions as to sourcing or not sourcing data in the data RAM and what data should be sourced; the second microcode RAM includes instructions as to sourcing or not sourcing data, where to start sourcing data, and the preparation for sourcing data; the second microcode RAM is connected to an instruction decoder which controls the sequential memory; and there is a timing set memory storing blocks of timing data for corresponding sequential vectors.

Other advantages and features of the invention will be apparent from the following description of a preferred embodiment thereof and from the claims.

DESCRIPTION OF THE PREFERRED EMBODIMENT

The preferred embodiment will now be described.

Drawings

FIG. 7 is a listing of state addresses and conditions illustrating a method of using the FIG. 1 tester.

STRUCTURE

Figure 1:
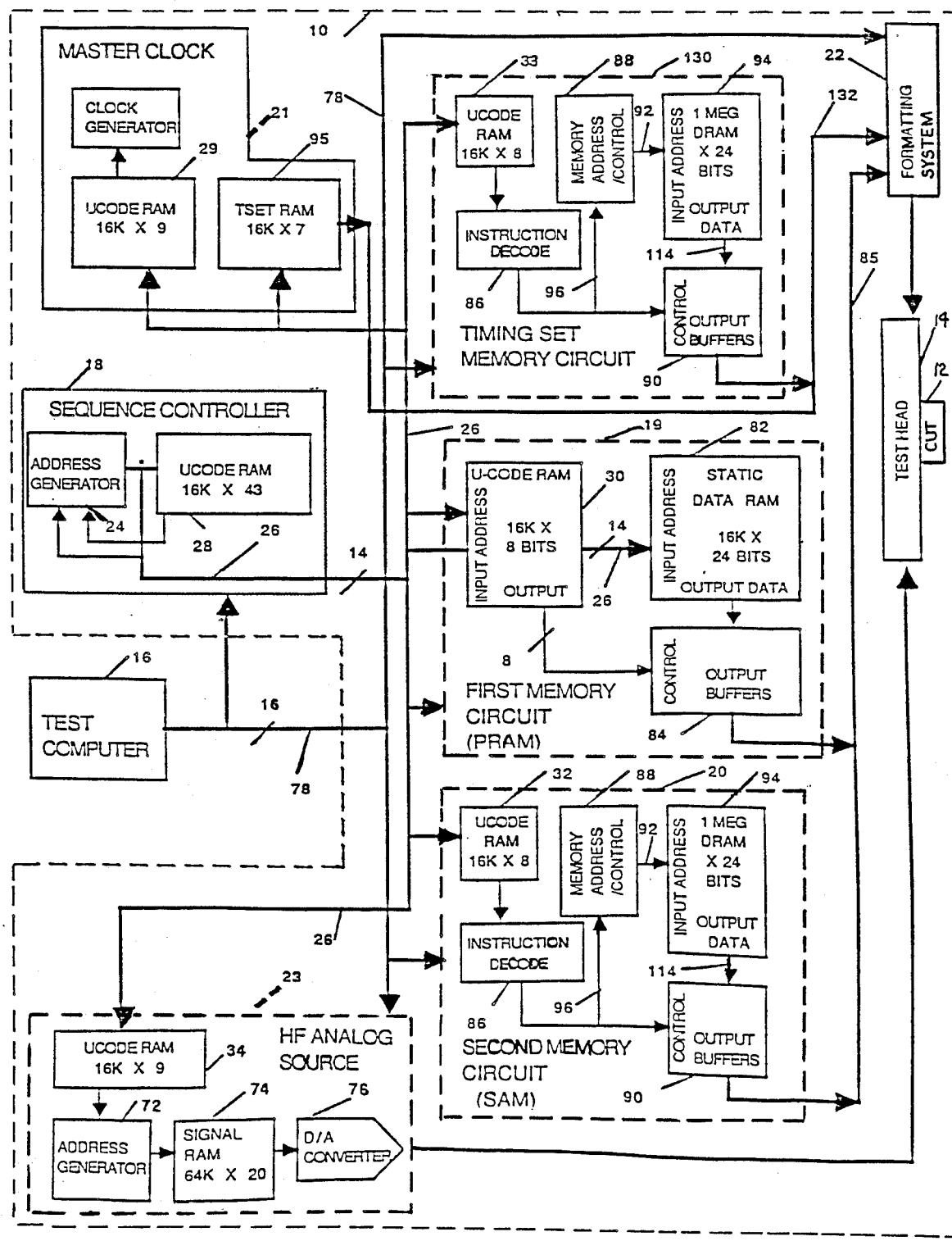
FIG. 1 is a block diagram of an automatic circuit tester according to the invention.

Referring to FIG. 1, there is shown automatic circuit tester 10 for testing circuit under test ("CUT") 12, electrically connected to test head 14. Test computer 16 provides overall control of the apparatus, including sequence controller 18, which is used to simultaneously deliver a large number of data to CUT 12, using first test pattern memory circuit 19, second test pattern memory circuit 20, timing set (T-set) memory circuit 130, and formatting system 22. Sequence controller 18 is also used to provide control signals to the rest of the tester, e.g., master clock 21, high frequency (HF) analog source 23, and other instruments (not shown) synchronously with the clocking of CUT 12 at its high rate, e.g., 25 MHz. Tester 10 also includes detectors (not shown) for detecting outputs of CUT 12. Sequence controller 18 includes address generator 24 connected to 14-bit state address bus 26 and sequence microcode RAM 28 (16K by 43 bits), containing the control bits for the control signals for the tester and for sequence controller address generator 24. State address bus 26 is connected to first memory microcode RAM 30 (16K×8 bits), second memory microcode RAM 32 (16K×8 bits), t-set microcode RAM 33 (16K×8 bits), HF analog microcode RAM 34 (16K×9 bits), clock microcode RAM 29 (16K×9 bits) of master clock 21, and other microcode RAMs in other instruments (not shown).

State address bus 26 also contains a condition bit that allows events in HF source 23 and clock 21 to affect the address generated by sequence controller address generator 24. Events at CUT 12 may also affect the address generator 24 by way of formatting system 22, test pattern memory circuit 19 or 20, and the condition bit in state address bus 26.

First test pattern memory circuit 19 is distributed on ten circuit boards, the components for a single circuit board being shown on FIG. 1. State bus 26 is connected to directly address the data of conditional vectors stored in data RAM 82 (16K by 24-bit static RAM). First memory microcode RAM 30 is connected to control output buffers 84. Each circuit board of circuit 19 includes the RAM for eight channels, each channel requiring 3 bits in order to indicate the type of input to be applied by formatting system 22 to a single input of CUT 12.

Second test pattern memory circuit 20 is similarly distributed on ten circuit boards, the components for a single circuit board being shown on FIG. 1. Second memory microcode RAM 32 is connected to provide instructions to its associated instruction decoder 86, in turn connected to provide control signals to memory address/control circuit 88 and to output buffers 90. Memory address/control circuit 88 employs 25-bit addresses to address 24-bit, one-MEG deep sequential memory 94. Of the 25 bits of address, 20 are needed to provide one million addresses; additional address bits are provided to permit increasing the memory depth to 32 MEG, the additional five bits being used to provide page select capability. Second memory circuit 20 can be configured to output one channel (with three bits indicating type), eight million vectors deep.

T-set memory circuit 130 has the same structure as a single board of second test pattern memory circuit 20. However, the data stored in T-set memory circuit 130 are different from those stored in second test pattern memory circuit 20. Sequential memory 94 of T-set memory circuit 130 utilizes seven of its 24 bits; the remaining bits are masked. Output buffers 90 of T-set memory circuit 130 are connected to formatting system 22 via timing bus 132. The seven bits are used to provide vector-by-vector control of timing by formatting system 22 of inputs that are provided to CUT 12 based on data from sequential memory 94 of second memory circuit 20; i.e., timing can be changed for each vector in a block of sequential vectors. Timing information for data in data RAM 82 of first test pattern memory circuit 19 is stored in T-set RAM 95 of master clock 21.

Figure 2:
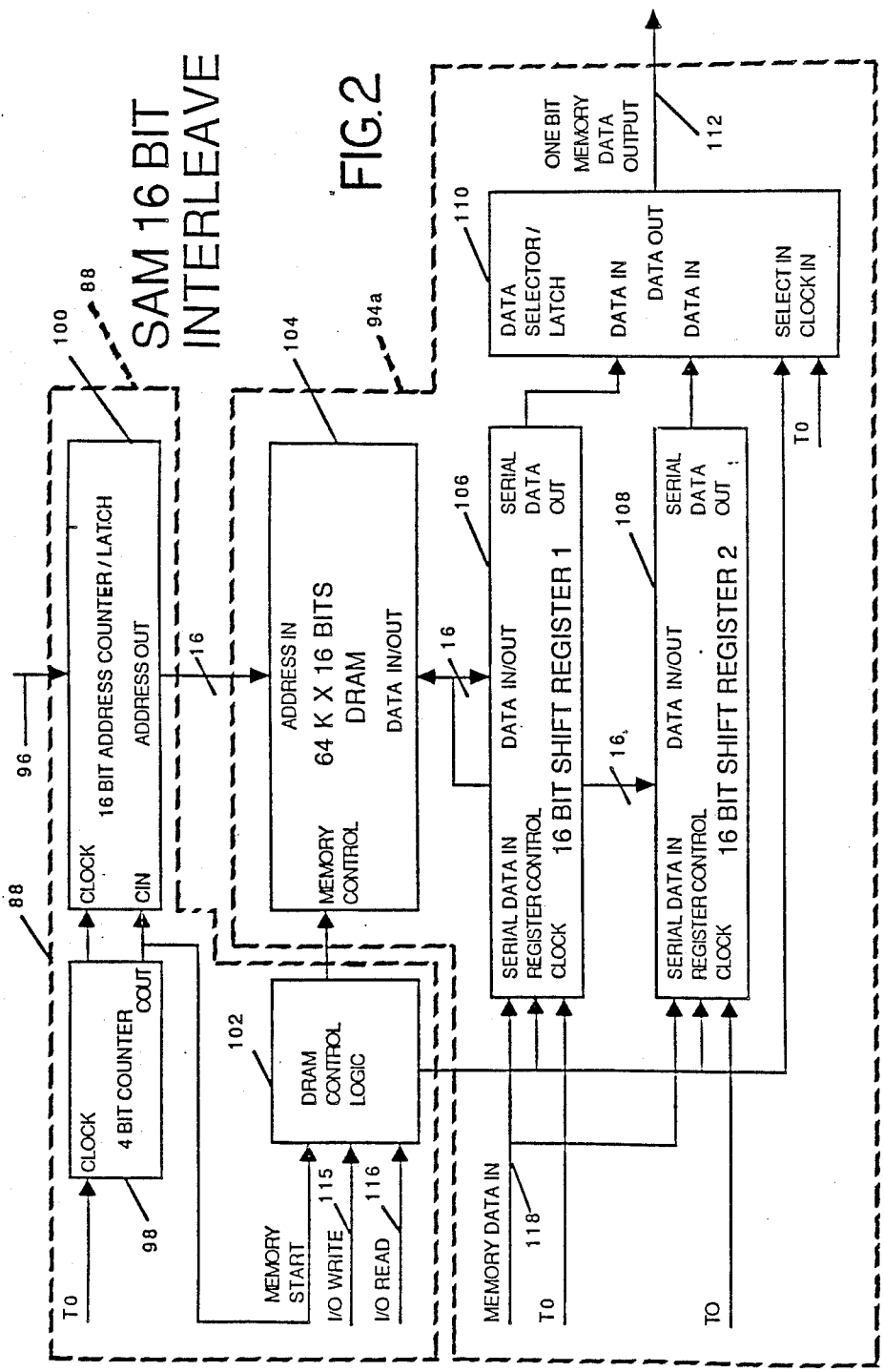
FIG. 2 is a block diagram of an interleaved sequential data memory of the FIG. 1 tester.

Referring to FIG. 2, there is shown memory address-/control circuit 88 and sequential memory subcircuit 94a, providing the storage for a single bit of the 24-bit output of sequential memory 94 (FIG. 1). There thus are 24 subcircuits 94a on a single circuit board. Memory address control circuit 88 includes 4-bit counter 98, the carry-out output of which is connected as a carry-in input to 16-bit address counter/latch 100 and to dynamic RAM (DRAM) control logic 102. The input on bus 96 to 16-bit counter/latch 100 presets the counter at an address corresponding to the address for the data of the first sequential vector in a block of sequential vectors to be provided by sequential memory 94. Sequential memory subcircuit 94a includes 64K by 16-bit DRAM 104 (four 64K×4-bit DRAMs, addressed in parallel, the four 4-bit outputs combined to provide 16-bits) addressed by address counter/latch 100. There thus are 1 MEG (64K×16-bits) bits of storage in DRAM 104. The data in/out terminals of DRAM 104 are connected to shift registers 106, 108, which are connected in parallel and controlled by DRAM control logic 102 so as to alternate, during testing, between the 16-bit parallel input mode and 16-bit serial data output mode. The serial data outputs of registers 106, 108 are provided to data selector/latch 110, the output of which is provided over line 112 as a single bit of 24-bit bus 114 to output buffers 90 (FIG. 1). The I/O write and I/O read control lines 115, 116 of DRAM control logic 102 and "memory data in" lines 118 connected to shift registers 106, 108 are connected to 16-bit test computer address bus 78 (FIG. 1).

Returning to FIG. 1, high frequency analog source microcode RAM 34 is connected to provide instructions to its associated address generator 72, which provides addresses to signal RAM 74 (64K by 20 bits), loaded with a digital representation of an analog signal; signal RAM 74 is connected to read out the digitized signal to D/A converter 76, which provides an analog signal to CUT 12. High frequency analog source instrument 23 thus is an analog signal generator.

Tester 10 can also include an HF analog capture instrument, a low frequency analog capture instrument, and a low frequency analog source instrument (all not shown), all having microcode RAMs connected to state address bus 26. Address generator 72 of HF analog source 23 and data RAM 82 of first test pattern memory circuit 19 are also connected to 16-bit test computer bus 78 for data input and control by test computer 16 when sequencer 18 is not carrying out high speed testing. Pipeline registers (not shown) are distributed along state address bus 26 and throughout tester 10 along the paths from microcode RAMs to sources of signals actually presented to CUT 12; the pipeline registers sequentially advance addresses along sequence address bus 26, and addresses and other digital signals along other paths.

Operation

Figure 3:
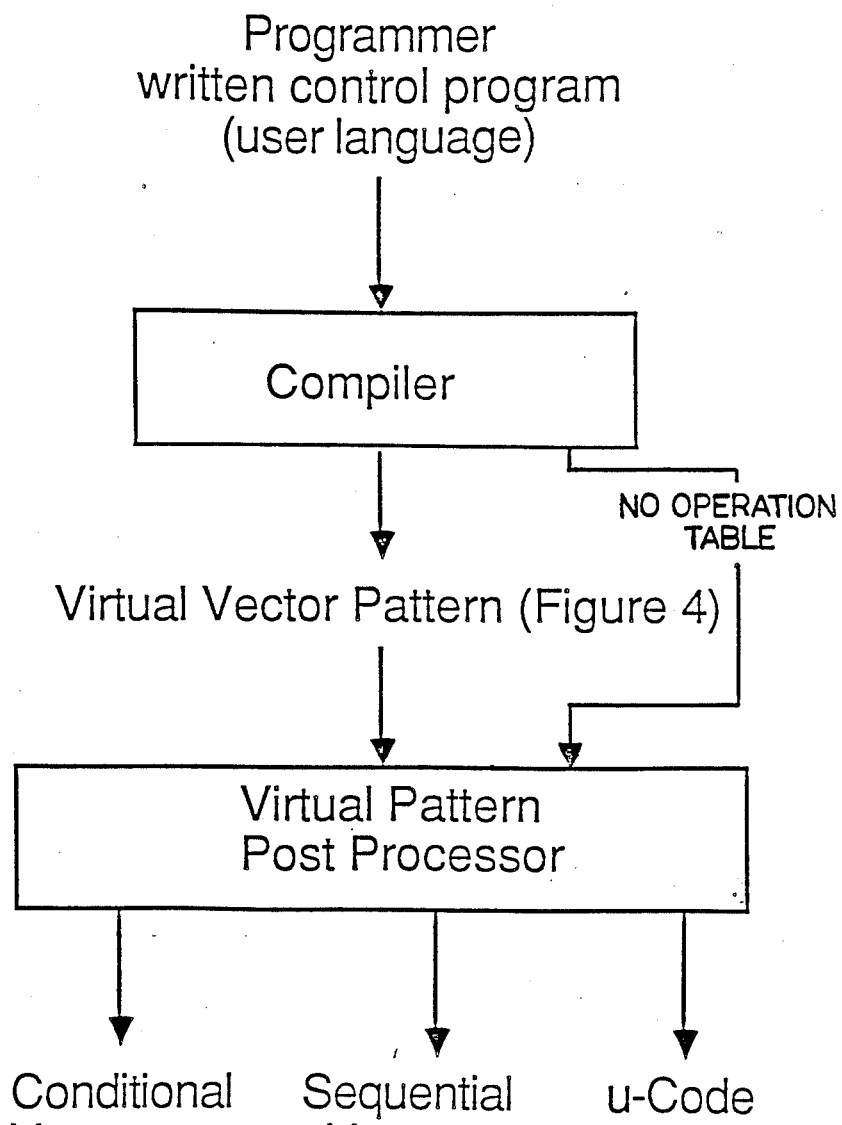
FIG. 3 is a flow chart describing a method of generating lists of data of nonsequential and sequential vectors.
Figure 4:
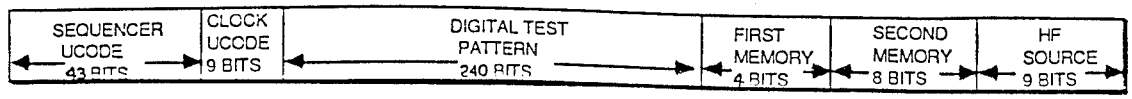
FIG. 4 is a diagram of a virtual vector format for the FIG. 1 apparatus.

Referring to FIG. 3, prior to testing of CUT 12, a control program is written for apparatus 10 as if there were 1 MEG deep memory storage capacity for both the microcode and data in all vectors in the program and as if any vector can be randomly accessed, e.g., when the program jumps at conditional vectors, without regard to the address to which the program jumps. The user writes his program in the user language, indicating what digital patterns are to be provided at what pins of the CUT 12 at what time and what other signals and controls should be provided by high frequency analog source 23 and other instruments. The control program is then converted into microcode bits and the digital test pattern bits at a compiler working as if there is 1 MEG storage for every pattern. The microcode bits and digital test pattern bits are referred to as "virtual vectors". The virtual vector format is shown in FIG. 4. The compiler also constructs a "sequential table", as described in detail below. The output of the compiler also has labels indicating destinations of transfers. A post processor reviewing the virtual vectors and the sequential table lists the data in the sequential vectors for routing (with some exceptions) to sequential memory 94, lists the data in the nonsequential vectors for routing to data RAM 82, and prepares additional microcode.

When generating the sequential table, the compiler scans the virtual vector pattern one vector at a time to locate "discontinuities", which indicate nonsequential vectors, within the test pattern of vectors. Vector features identifying discontinuities are: a start of a pattern; a branch of control flow (i.e., jumps, subroutine calls, etc.); an object (i.e., destination) of transfer; and any channel of a vector which involves an alternative source for its data (e.g., HF analog source 23). Each virtual vector has a sequential "vector number" assigned to it; i.e., a pattern of n vectors would have n virtual vector numbers. For each block of consecutive sequential vectors, the starting vector in the block and the number of vectors in the block of sequential vectors are stored as paired entries in the sequential table.

Figure 5:
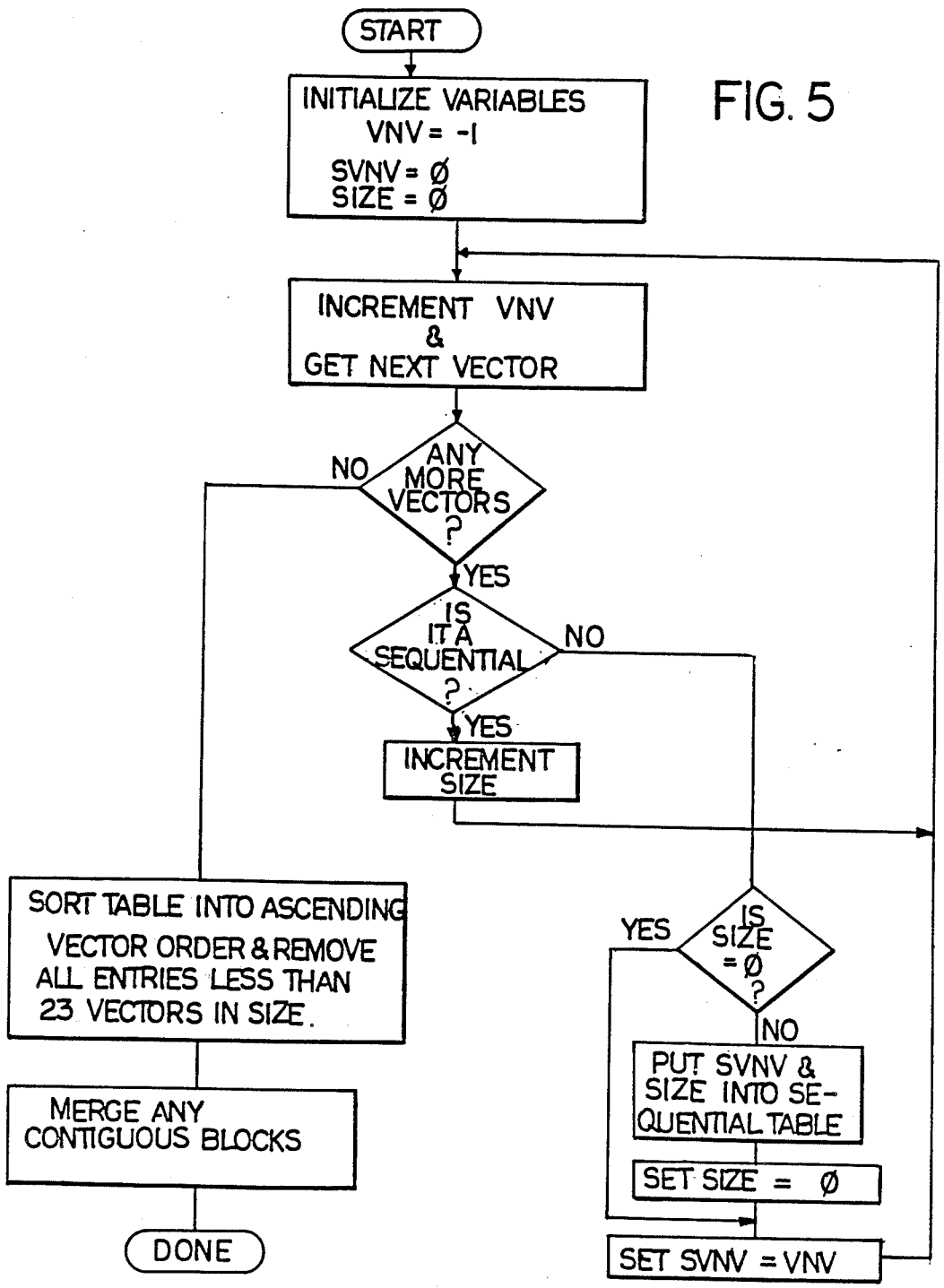
FIG. 5 is a flow chart describing a method of operation of a compiler in carrying out the invention.

Referring to FIG. 5, when generating the sequential table, a vector number variable ("VNV") is initialized to −1, a start vector number variable ("SVNV") is initialized to zero, and the size of block variable ("SIZE") is initialized to zero. VNV is then incremented, and the next vector is retrieved. This next vector is checked to see if it is a sequential vector according to the above criteria for discontinuities. If it is, SIZE and VNV are incremented, and the next vector is retrieved. If it is not a sequential vector, it is determined whether this vector is the first nonsequential vector following a block of sequential vectors (SIZE not equal to zero) or whether it is within a block of nonsequential vectors (SIZE equal to zero). If the former, the current SVNV and SIZE are listed in the sequential table, and SIZE is reset to zero so that it can be used to count the next block of sequential vectors. If the latter, these steps are by-passed. SVNV is then set equal to VNV, VNV is incremented, and the next vector is retrieved.

When there are no more virtual vectors, the sequential table is sorted into ascending vector order, all entries less than 23 vectors in size ("sequential fragments") are removed, and any contiguous blocks are merged. The blocks of sequential vectors greater than 23 vectors long are thus described directly in the resulting sequential table, and the remaining blocks of nonsequential vectors and sequential fragments can be inferred from the gaps in the table. This table is used as the basis for splitting the virtual pattern into its components.

In addition to generating the virtual vectors and the sequential table, the compiler also generates symbol tables that are used for resolving transfers (e.g., jumps, conditionals) within the virtual vector pattern. The symbol tables that are generated include a destination table, which stores vectors which are destinations from transfers, and a vector transfer table, which stores vectors that contain transfers.

Figure 6:
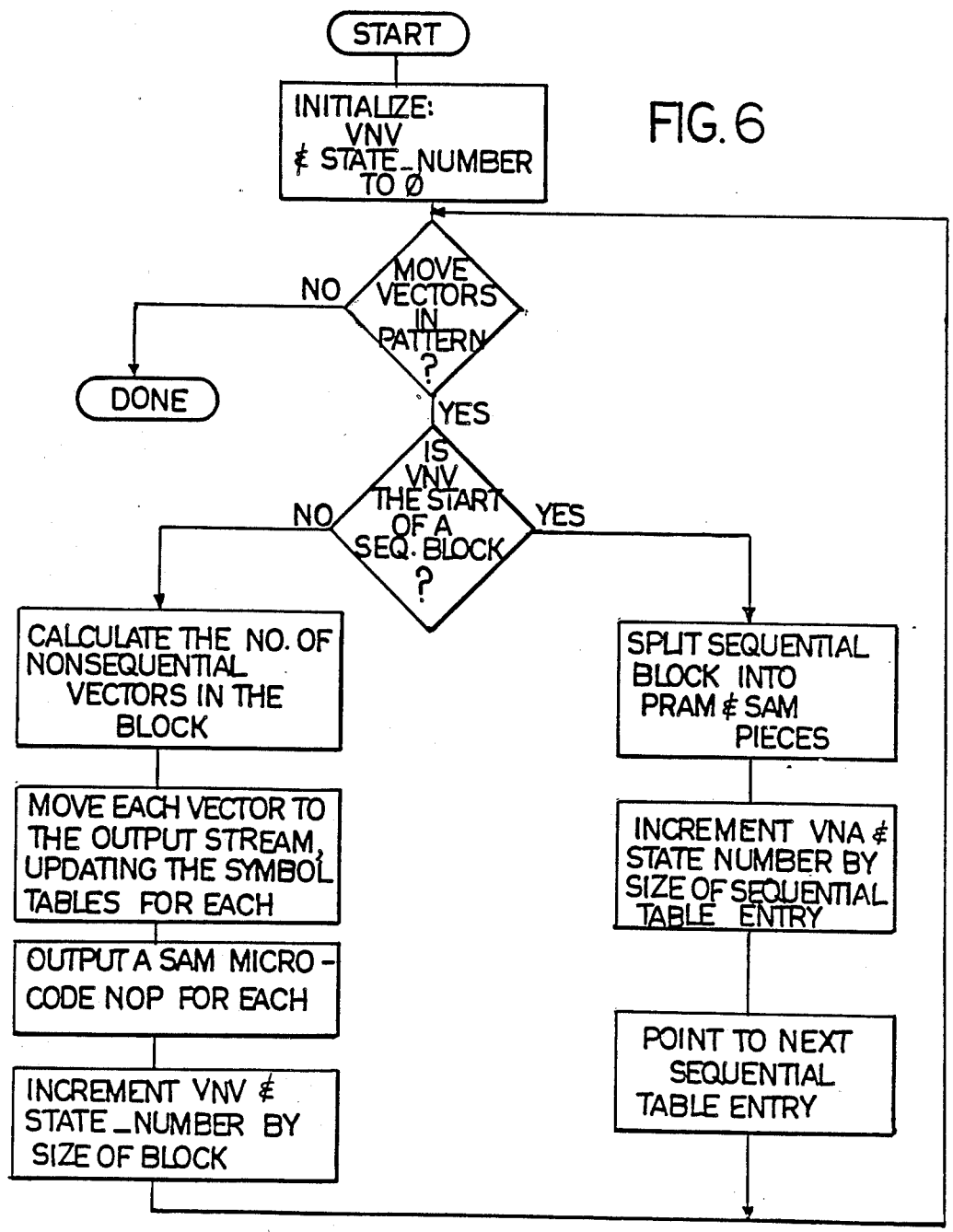
FIG. 6 is a flow chart describing a method of operation of a post processor in carrying out the invention.

Referring to FIG. 6, there is shown the pattern splitting method used by the post processor to list data of blocks of sequential vectors for storing in sequential memory 94 and to list blocks of nonsequential data and sequential fragments in data RAM 82 (the latter blocks referred to as "nonsequential blocks"). A VNV and a state number variable ("state number") are first initialized to zero, and a pointer is set to the first entry in the sequential table. The virtual pattern is processed block-by-block, the nonsequential blocks being processed differently than the sequential blocks. The VNV is first compared to the first starting virtual vector number identified by the sequential table pointer. If they are not the same, then the virtual vector is part of a nonsequential block; otherwise the virtual vector is the first vector in a sequential block.

Addressing the handling of nonsequential blocks first, the number of vectors in the present nonsequential block is calculated by subtracting VNV from either the next sequential block starting vector number (retrieved from the sequential table) or the end of the pattern (if this vector occurs after the final sequential block). Each vector within the nonsequential block is assigned a consecutive state number (related to state addresses that appear on state address bus 26), and the data of the vector are then moved to the output stream to be stored in data RAM 82, adjusting the symbol tables to compensate for the compression of the virtual vector pattern size. In addition, the second memory microcode (for storing in microcode RAM 32) is outputted a "no-operation instruction" for each state number of this nonsequential block. VNV and the state number are then increased by the size of the nonsequential block, and the next vector is retrieved.

Addressing the handling of sequential blocks, the first 18 vectors of the sequential block block are listed for placing in microcode RAM 30 and data RAM 82 and are assigned the next 18 state numbers. (Thus, the data of some sequential vectors are stored in data RAM 82 with the data of nonsequential vectors.) A sequential vector address (25 bits, the lower 4 of which are preset to zero; used to address sequential memory 94) is listed for storing as SAM microcode in second memory microcode RAM 32 at state addresses corresponding to the first three state numbers of the group of 18 just mentioned. The remaining vectors of the sequential block are then listed for storing in sequential memory 94, and assigned respective consecutive sequential vector addresses. The total number of sequential vectors in the block to be executed from sequential access memory 94 is calculated and used to determine the variables (X, y and rem) of the "SAM drive portion" microcode (for microcode RAM 29), used to permit sequence controller 18 to mark time while sequential data is sourced by sequential memory 94. The SAM drive portion consists of the following microcode, where "setloop x" is part of the first 18 vectors:

setloop x
L1: setloop y
L2: endloop L2
endloop L1
setloop rem
L3: endloop L3, where the number of vectors executed from SAM is given by the following formula:

number of SAM vectors = $x*(y+1)+\text{rem}+2$

The SAM drive portion utilizes nested loops in order to decrease the size of the counters needed to mark time by sequence controller 18.

After the block of sequential vectors has been processed, VNV is increased by the size of the sequential block, the sequential table pointer is advanced to the next entry of the sequential table, and the next vector is retrieved.

This procedure is continued until there are no blocks of vectors left in the virtual vector pattern. The post processor also prepares microcode necessary for carrying out the selective routing of test patterns from data RAM 82 and sequential memory 94, including the 8 bits of microcode for first test pattern memory circuit 19 and the 8 bits of microcode for second test pattern memory circuit 20. The microcode relating to transfers is listed for storing in sequence microcode RAM 28. The compiled and processed program is ready for loading into the appropriate hardware 10.

Referring to FIG. 1, microcode RAMs 28, 29, 30, 32, 33, 34 are loaded with their respective microcode instructions, and data RAM 82 and DRAMs 104 are loaded with their digital test patterns, all under the control of test computer 16 over computer bus 78. In loading into data RAM 82 and the various microcode RAMs, the state addresses are different than the state numbers assigned by the post processor, but the relative positions remain the same; this permits loading a plurality of test programs that have been post-processed at different times. The test data in first test pattern memory circuit 19 are simply loaded into data RAM 82 in parallel (via means not shown) while addresses are provided to it. Referring to FIG. 2, the test data being loaded into DRAMs 104 are first transmitted over memory data input lines 118 into shift registers 106 or 108 and are then loaded 16 bits at a time into DRAMs 104 at the respective addresses. One shift register 106 or 108 receives serial data in while the other provides 16 bits in parallel to DRAM 104, the respective addresses being provided by 16-bit address counter/latch 100. Then the other register 106 or 108 receives the data serially while the first one provides it in parallel, and so on. As appears from the discussion of the operation of sequential memory 94, the 24 bits of data of a single sequential vector are distributed to each of the 24 sequential memory subcircuits 94a.

The microcode stored in first microcode RAM 30 either indicates that data should be sourced at a specific address which is passed over state bus 26 to data RAM 82 or indicates that no data are to be sourced from data RAM 82. The microcode stored in second microcode RAM 32 and T-set microcode RAM 33 include instructions as to sourcing or not sourcing, where to start, and preparation for sourcing. As there are only eight bits of microcode in microcode RAMs 32, 33, three consecutive microcode addresses are used to indicate the beginning address in sequential memory 94. (Twenty-one of the address bits come from seven bits of three consecutive eight-bit microcode instructions; the remaining four bits of the 25-bit address are preset to zero.)

During high-speed testing under the control of sequence controller 18, addresses provided to state bus 26 by address generator 24 cause instructions to be provided to the instruments from their associated microcode RAMs synchronously with the delivery of data to CUT 12 at its clock rate. The addresses provided to state bus 26 also cause the selected digital test patterns stored in data RAM 82 and sequential memory 94 to be provided on vector bus 85 to formatting system 22. Master clock 21 provides programmable clocking for apparatus 10. High frequency analog source 23 may affect the addresses generated by sequence controller address generator 24, by the condition bit in state address bus 26. Events in CUT 12 may also affect the addresses generated by sequence address generator 24, by way of formatting system 22.

Referring to FIG. 7, there is shown a listing indicating state addresses on state address bus 26 and related conditions during an example of operation including both nonsequential vectors and sequential vectors. During initial operation, a large block of nonsequential vectors is to be applied; thus the data are sourced from data RAM 82 while sequential memory 94 remains inactive. At the first clock period, that associated with state address zero, the microcode in first microcode RAM 30 indicates that first memory circuit 19 should source data, and the microcode in second microcode RAM 32 indicates that there should be no operation for second memory circuit 20. The same operation applies for the next 101 steps, corresponding to state addresses 1-101. Hardware pipelining in first memory circuit 19 provides seven clock periods from the time that the state address indicating sourcing is provided on state bus 26 to the time that the corresponding data are provided on vector bus 85. Timing set information (e.g., indicating at what precise time in a clock period edges of inputs to CUT 12 are to be provided) is also provided from 16K deep microcode RAM 95 in master clock 21.

The beginning of a block of sequential vectors in the user program corresponds to state address 102 for second memory 20 and state address 120 for first memory 19, as it takes 25 clock periods for sequential memory 94 to begin providing data to vector bus 85, and only seven clock periods for data RAM 82, as noted above. State addresses 102-104 cause 21 of the 25 bits identifying the beginning address of the data in sequential memory 94 to be provided seven bits at a time in three different clock periods; the loading of the third instruction causes presetting of the lower four bits of the 25-bit address mentioned above to zero. During the eighteen clock periods corresponding to state addresses 102-119, first memory circuit 19 continues to source data to vector bus 85, while second memory circuit 20 is preparing for sourcing of data from it. At state address 120, the microcode instructions in microcode RAM 30 tell data RAM 82 to stop sourcing data; because of the seven clock period pipeline, the data on vector bus 85 continue to be received from first memory circuit 19 for seven more clock periods.

Starting at state address 127, the data from second memory circuit 20 are provided to vector bus 85, dynamic RAMs 104 providing data through shift registers 106, 108, data selector latch 110, and output buffers 90. In this operation, the initial address in address counter/latch 100 is set by instructions over bus 96 from instruction decoder 86; this is the first address of data to be sourced in a block of sequential data. Four bit counter 98 repeatedly counts 16 clock pulses and provides its carry-out pulse to 16-bit address counter/latch 100 and DRAM control logic 102 at each count of 16. Address counter/latch 100 increments the address provided on its output lines to DRAM 104 upon receiving each carry out from counter 98. At each carry-out pulse, a 16-bit word is read from DRAM 104 into shift register 106 or shift register 108; this 16-bit word represents the data of a single bit of sixteen consecutive vectors at sixteen consecutive clock periods. The shift register not receiving input has its 16-bit word serially read out into data selector/latch 110. On the next carry-out pulse, the last-mentioned register then receives the 16-bit word in parallel while the other register provides its 16-bit word serially to data selector/latch 110. The output at line 112 is a single bit, and the bits from the 23 other sequential memory subcircuits 94a are provided to output buffer 90, where they are combined to provide a 24-bit word to vector bus 85. At the same time, timing set information is provided by timing set memory circuit 90 in a similar manner to timing set bus 132. While dynamic RAMs 104 are read at a rate that is slower than that for reading static RAMs 82, each of the 24 data selector/latches 110 provides its output to its line 112 of 24-bit bus 114 to buffers 90 at high speed. In this manner the less expensive dynamic RAMs are used to provide blocks of data of sequential vectors at high speed.

While the block of sequential vectors is being provided to vector bus 85 and the timing data are being provided to timing bus 132, the state addresses 127–131 appear on state address bus 26 as a result of the nested-loop operation the SAM drive portion of the block used to mark time by sequence controller 18. When it is seven clock periods before the end of the block of sequential vectors, the new state address 132, is provided on state address bus 26; the corresponding microcode instruction in microcode RAM 30 tells first memory circuit 19 to begin sourcing data, and the microcode instruction in microcode RAM 32 tells memory circuit 20 to cease sourcing data. Memory circuit 20 continues to provide data to buses 85 for seven more clock periods.

OTHER EMBODIMENTS

Other embodiments of the invention are within the scope of the following claims.

CLAIMS

What is claimed is:

1. Apparatus for providing high speed control of digital test patterns in automatic test equipment, said apparatus comprising,
   a first memory circuit including a data random access memory (RAM) storing data of nonsequential vectors, said data RAM having a first storage capacity,
   a second memory circuit including a sequential data memory storing blocks of data of sequential vectors, said sequential memory having more storage capacity than said first storage capacity,
   a formatter for receiving data from said data RAM or said sequential data memory and using the data to provide inputs to a circuit under test,
   a sequence controller controlling said first and second memory circuits for selectively routing data from said data RAM or said sequential data memory to said formatter,
   a state address bus connected to said first memory circuit, said second memory circuit and said sequence controller, and
   a sequence address generator, said sequence address generator providing address information to said first memory circuit, said second memory circuit and said sequence controller via said state address bus.

2. The apparatus of claim 1 wherein said data RAM comprises static RAMs, and said sequential data memory comprises a plurality of dynamic RAMs that are individually slower than said static RAMs, said dynamic RAMs having outputs that are combined to provide high-speed data transfer.

3. The apparatus of claim 2 wherein said sequential memory includes shift registers that are each connected to receive a multibit parallel output of a respective said dynamic RAM and to provide a serial shift register output, and said dynamic RAMs each provide a multibit word that corresponds to a single bit of data of a plurality of consecutive sequential vectors.

4. The apparatus of claim 2 wherein said data RAM has stored in it data of some sequential vectors prior to said blocks to permit said dynamic RAMs to be primed to provide data at a high speed.

5. The apparatus of claim 1 wherein
   said sequence controller includes said sequence address generator, said state address bus being connected to the sequence address generator, and
   said first memory circuit includes a first microcode RAM that is loaded with microcode for said first memory and is connected to receive addresses from said state address bus,
   said microcode for said first memory including instructions as to sourcing or not sourcing data in said data RAM.

6. The apparatus of claim 5 wherein said second memory circuit includes
   a second microcode RAM loaded with microcode for said second memory and connected to receive addresses from said state address bus,
   said microcode for said second memory including instructions as to sourcing or not sourcing, where to start sourcing, and preparation for sourcing.

7. The apparatus of claim 6 wherein said second memory circuit includes an instruction decoder connected to receive instructions from said second microcode RAM, and a memory address/control circuit and output buffers for said sequential data memory controlled by said decoder.

8. The apparatus of claim 1 further comprising,
   a timing set memory storing blocks of timing data corresponding to said blocks of data of sequential vectors,
   said timing set memory providing timing data to said formatter.

9. A method of providing high-speed control of digital test patterns in an automatic circuit tester comprising
   preparing a virtual vector pattern containing nonsequential vectors and sequential vectors,
   preparing instructions for storing data of said nonsequential vectors in a data RAM of a first memory circuit and for storing blocks of data of sequential vectors in a sequential data memory of a second memory circuit, loading said data of said nonsequential vectors in said data RAM of said first memory circuit, loading said data of said sequential vectors in said sequential data memory of said second memory circuit, providing address information from a sequence address generator to said first memory circuit and said second memory circuit via a state address bus, said state address bus being connected to said first memory circuit, and said second memory circuit, and utilizing said address information in selectively routing data from said data RAM or said sequential data memory to a formatter for use in providing inputs to a circuit under test.

10. The method of claim 9 further comprising preparing first and second microcode for said first and second memory circuits so that data are respectively sourced from said data RAM or said sequential data memory in response to addresses on a state bus of said automatic circuit tester, and loading said first microcode in a first microcode RAM in said first memory circuit and loading said second microcode in a second microcode RAM in said second memory circuit.

11. The method of claim 9 wherein said virtual vector pattern has labels associated with some said nonsequential vectors to indicate the destination of a transfer and further comprising preparing a list of labels in a destination table.

12. The method of claim 11 further comprising preparing a list of transfers in a vector transfer table.

13. The method of claim 9 wherein said data RAM comprises static RAMs, and said sequential data memory comprises a plurality of dynamic RAMs that are individually slower than said static RAMs, and wherein said sourcing said data from said sequential data memory comprises combining the outputs of said dynamic RAMs to provide high-speed data transfer.

14. The method of claim 13 wherein said sourcing said data from said sequential data memory comprises inputting multibit words of said dynamic RAMs into shift registers, outputting said multibit words one bit at a time, and combining serial bit outputs of said shift registers to obtain multibit word outputs at high speed.

15. The method of claim 14 wherein each said dynamic RAM has a pair of said shift registers, a register of each pair inputting multibit words while the other is outputting and vice versa.

16. The method of claim 14 further comprising loading data of some sequential vectors prior to blocks of sequential data stored in said sequential memory to permit said dynamic RAMs to be primed to provide data at a high speed.

17. The method of claim 16 wherein said loading said data of sequential vectors comprises generating a starting address in said dynamic RAMs for the beginning of a said block of data of sequential data, said generating including combining portions of said starting address stored at consecutive addresses of a microcode RAM addressed by said state address bus.

18. The method of claim 9 further comprising, storing blocks of timing data in a timing set memory, said blocks of timing data corresponding to said blocks of data of sequential vectors, and providing said timing data to said formatter when selectively routing data from said sequential data memory.

19. The method of claim 9 wherein said preparing instructions includes generating a sequential table representative of blocks of said sequential vectors, where each entry in said table corresponds to a block of consecutive sequential vectors.

20. The method of claim 19 wherein said generating a sequential table further comprises including in each entry of said sequential table a start sequential vector corresponding to the first vector of said block and a size number representative of the number of said sequential vectors in said block.

21. The method of claim 20 wherein said generating a sequential table comprises retrieving a vector from said virtual vector pattern, determining whether said vector is a nonsequential vector or a sequential vector, incrementing said size number if said vector is a said sequential vector, and saving said size number if said vector is a said nonsequential vector and is the first said nonsequential vector after a said sequential vector, 22. The method of claim 21 wherein said generating a sequential table further comprises removing any said entry of said sequential table in which said size number is smaller than a predetermined size.

23. The method of claim 20 wherein said preparing instructions includes splitting said virtual vector pattern into sequential blocks and nonsequential blocks utilizing said sequential table.

24. The method of claim 23 wherein splitting further comprises assigning state numbers to vectors in said nonsequential blocks, said state numbers corresponding to state addresses provided on said state address bus of said automatic tester.

* * * * *